US008816293B2

United States Patent
Perna

(10) Patent No.: US 8,816,293 B2
(45) Date of Patent: Aug. 26, 2014

(54) CURVED SCINTILLATION CRYSTAL ARRAY

(71) Applicant: Louis Perna, Elyria, OH (US)

(72) Inventor: Louis Perna, Elyria, OH (US)

(73) Assignee: Saint-Gobain Ceramics & Plastics, Inc., Worcester, MA (US)

( * ) Notice: Subject to any disclaimer, the term of this patent is extended or adjusted under 35 U.S.C. 154(b) by 0 days.

(21) Appl. No.: 13/909,869

(22) Filed: Jun. 4, 2013

(65) Prior Publication Data

US 2013/0320240 A1 Dec. 5, 2013

Related U.S. Application Data

(63) Continuation of application No. 12/473,781, filed on May 28, 2009, now Pat. No. 8,476,599.

(60) Provisional application No. 61/057,411, filed on May 30, 2008, provisional application No. 61/057,389, filed on May 30, 2008.

(51) Int. Cl.
| | |
|---|---|
| *G01T 1/20* | (2006.01) |
| *H01L 31/0232* | (2014.01) |
| *G01T 1/202* | (2006.01) |
| *H01L 27/146* | (2006.01) |

(52) U.S. Cl.
CPC .......... *G01T 1/202* (2013.01); *H01L 31/02322* (2013.01); *H01L 27/14663* (2013.01)
USPC .................................................. 250/370.11

(58) Field of Classification Search
USPC .................................................. 250/370.11
See application file for complete search history.

(56) References Cited

U.S. PATENT DOCUMENTS

| | | | |
|---|---|---|---|
| 4,914,301 A * | 4/1990 | Akai | 250/370.01 |
| 5,099,134 A | 3/1992 | Hase et al. | |
| 5,378,894 A * | 1/1995 | Akai | 250/368 |
| 5,866,908 A * | 2/1999 | Novak | 250/368 |
| 5,869,836 A | 2/1999 | Linden et al. | |
| 6,103,147 A | 8/2000 | Rybicki | |
| 6,222,192 B1 | 4/2001 | Sekela et al. | |
| 6,245,184 B1 | 6/2001 | Riedner et al. | |
| 6,359,282 B1 | 3/2002 | Sekela | |
| 6,362,479 B1 | 3/2002 | Andreaco et al. | |
| 6,881,960 B2 | 4/2005 | Schreiner et al. | |
| 6,909,097 B2 | 6/2005 | Schreiner et al. | |
| 7,138,633 B1 | 11/2006 | Rozsa et al. | |
| 7,692,156 B1 | 4/2010 | Nagarkar | |
| 7,872,750 B1 | 1/2011 | Wrbanek et al. | |
| 2005/0082491 A1 | 4/2005 | Seppi et al. | |
| 2005/0084073 A1* | 4/2005 | Seppi et al. | 378/156 |
| 2006/0065836 A1 | 3/2006 | Tsuchiya et al. | |

(Continued)

OTHER PUBLICATIONS

"Scintillation Products—Scintillation Crystal Arrays and Assemblies," Saint-Gobain Crystals, Saint-Gobain Ceramics & Plastics, Inc., dated 2004, 8 pages.

(Continued)

*Primary Examiner* — David Porta
*Assistant Examiner* — Djura Malevic
(74) *Attorney, Agent, or Firm* — Abel Law Group, LLP; Robert N. Young

(57) ABSTRACT

Partially and completely curved and spherical scintillation arrays are described. These arrays can provide improved imaging of a variety of subjects and objects.

20 Claims, 7 Drawing Sheets

(56) References Cited

U.S. PATENT DOCUMENTS

| | | |
|---|---|---|
| 2006/0124854 A1* | 6/2006 | Shah .................. 250/363.04 |
| 2006/0192308 A1 | 8/2006 | Juni |
| 2007/0007460 A1 | 1/2007 | Hochstetler et al. |
| 2007/0164223 A1* | 7/2007 | Hennessy et al. ......... 250/361 R |
| 2007/0194242 A1 | 8/2007 | Fiedler et al. |
| 2008/0099685 A1* | 5/2008 | Karp et al. .............. 250/363.03 |
| 2009/0065700 A1 | 3/2009 | Menge et al. |
| 2009/0236534 A1 | 9/2009 | Selfe et al. |
| 2009/0261262 A1 | 10/2009 | Hunt |
| 2009/0294683 A1 | 12/2009 | Perna |
| 2012/0132833 A1* | 5/2012 | Freund et al. ............. 250/505.1 |

OTHER PUBLICATIONS

"CurvePlate—Gamma Camera Detector Plate," Saint-Gobain Crystals & Detectors, Saint-Gobain Ceramics & Plastics, Inc., dated 2001, 2 pages.

* cited by examiner

CURVED SCINTILLATION CRYSTAL ARRAY

CROSS-REFERENCE TO RELATED APPLICATIONS

This present application is a continuation of U.S. patent application Ser. No. 12/473,781, filed May 28, 2009, entitled "CURVED SCINTILLATION CRYSTAL ARRAY," which in turn claims priority to U.S. Provisional Application 61/057,411, filed May 30, 2008, entitled "CURVED SCINTILLATION CRYSTAL ARRAY," and U.S. Provisional Application Ser. No. 61/057,389, filed May 30, 2008, entitled "SCINTILLATOR AND METHODS OF MAKING AND USING SAME." The subject matter of these applications is hereby incorporated by reference herein.

TECHNICAL FIELD

The present disclosure relates to radiation detectors and more particularly, to two and three dimensional scintillation arrays.

BACKGROUND INFORMATION

Scintillation detectors are generally used to detect radiation that is not easily detected by conventional photodetectors. A scintillator, or scintillation crystal, absorbs ionizing radiation and converts the energy of the radiation to a light pulse. The light may be converted to electrons (i.e., an electron current) with a photodetector such as a photodiode, charge coupled detector (CCD) or photomultiplier tube. Scintillation detectors may be used in various industries and applications including medical (e.g., to produce images of internal organs), geophysical (e.g., to measure radioactivity of the earth), inspection (e.g., non-destructive, non-invasive testing), research (e.g., to measure the energy of photons and particles), and health physics (e.g., to monitor radiation in the environment as it affects humans).

Scintillation detectors typically include either a single large crystal or a large number of small crystals arranged in a planar array. Many radiation scanning instruments include scintillation detectors that comprise pixellated arrays of scintillation crystals. Arrays can consist of a single row of adjoining crystal pixels (linear array) or multiple rows and columns of adjoining crystal pixels (2-D array). Linear and 2-D arrays can include thousands of crystal pixels and the system may be constructed and arranged so that an emission from each pixel can be individually detected by a photodetector.

SUMMARY

In one aspect a scintillation array is provided, the scintillation array comprising an array of scintillation pixel elements, each of the scintillation pixel elements having a front face and a rear face, wherein at least a first scintillation pixel element and a second scintillation pixel element are arranged such that each respective front face is disposed along a curve.

In another aspect a scintillation array is provided, the scintillation array comprising at least first and second cuboid shaped pixels fixed in the array wherein the z axis of the first pixel is non-parallel to the corresponding z axis of the second pixel.

In another aspect a scintillation detector is provided, the scintillation detector comprising a radiation source constructed and arranged to emit radiation toward a scintillator, an array comprising a plurality of pixels with spacing between each pixel, each of the plurality of pixels including a front face oriented toward a focal line wherein each front face is disposed along a curve.

In another aspect a method of making a scintillation array is provided, the method comprising forming a plurality of pixel elements by cutting a first set of parallel grooves into the rear face of a crystal having a front face and a rear face, the grooves passing less than completely through the crystal, splaying the crystal along a curve to expand the grooves into wedge shaped spaces, and at least partially filling the spaces with an adhesive to produce the scintillation array.

BRIEF DESCRIPTION OF THE DRAWINGS

These and other features and advantages will be better understood by reading the following detailed description, taken together with the drawings wherein.

DETAILED DESCRIPTION

Figure 1A:
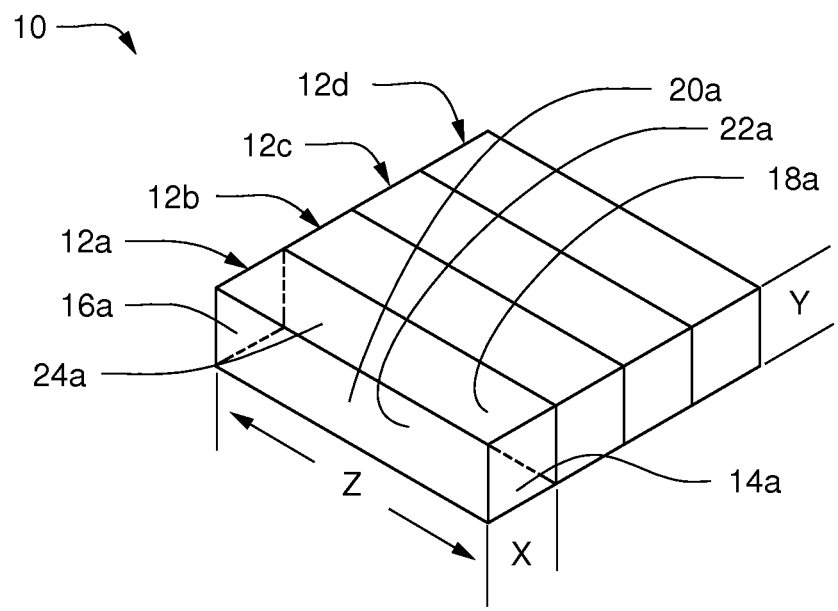
FIG. 1A depicts a linear array.

As used herein, the term "radiation" includes ionizing electromagnetic radiation and high-energy particles (e.g., gamma radiation, alpha particles and beta particles). "Detectable light" is the light output by a scintillator that can be detected by a photodetector. A "photodetector" converts detectable light emitted from a scintillation crystal into an electrical signal. The term "optically coupled" refers to at least one coupled element being adapted to impart light to another coupled element directly or indirectly. The term "scintillator" refers to a material that emits light ("scintillation light") in response to electromagnetic radiation incident thereon ("excitatory radiation"). Known scintillators include materials such as ceramic, crystal and polymer scintillators. A "scintillation crystal" is a scintillator made primarily of inorganic crystal. "Scintillation pixels" are known to those of skill in the art and comprise individual scintillators that are each associated with a photodetector. Multiple scintillation pixels can be associated together to form a "scintillation array." The detectable light from each pixel can be independently detected. The pixels may be separated from each other and may be joined via a common substrate. A single curved crystal having a smooth continuous surface does not constitute an array. A "planar array" is an array in which all of the pixels of the array lie in a common plane. An "adhesive" as used herein is a material that can be used to join independent pixels together in an array or to preserve the spacing between pixels.

In general, a pixelated scintillation array, consistent with embodiments described herein, includes a pixelated scintillation array that is curved in at least one dimension. Pixels may be arranged such that a front (incident to radiation) face of a first and second scintillation pixel elements are disposed along a curve and the pixels define a wedge-shaped gap between a sidewall surface of the first scintillation pixel element and a sidewall surface of said second scintillation pixel element. In one embodiment, the pixel array is formed by cutting a crystal to a predetermined depth to form individual pixel elements, and leaving a substrate of crystal material of sufficient thickness to permit a degree of flexibility in the array while binding the crystals in the array together as a unit. In other embodiments, the array may comprise a plurality of unconnected pixel elements. The array can include a linear array and/or a two dimensional (2D) array and/or a three dimensional (3D) spherical array.

In one set of embodiments the pixel elements may include (be made of) one or more crystals. Appropriate crystals include those known to have scintillation properties such as, for example, cesium iodide (Csi), thallium doped cesium iodide (Csi(Tl)), bismuth germinate (BGO), thallium doped sodium iodide (Nai(Tl)), barium fluoride (BaF2), europium doped calcium fluoride (CaF2(Eu)), cadmium tungstate (CdWO4), cerium doped lanthanum chloride (LaCb(Ce)), cerium doped lutetium yttria silicates (LuYSiOs(Ce)), silver doped zinc sulfide (ZnS(Ag)) or yttrium aluminum garnet (Y3Als012(Ce)). Crystals may be polycrystalline or single crystal in nature. The incident face of the pixels may be of any appropriate shape including square or polygonal. The pixels may be cuboid in shape and sized in the x, y and z (x-ray depth) dimensions to match the requirements of the instrument with which the array is used.

In one aspect, a curved scintillation array allows the incident surface of each of a plurality of pixels to be oriented towards the radiation source and/or the object or subject that is being scanned. The curvature can allow positioning of the pixels of the array in a formation where the pixels are equidistant from the surface of the object being scanned or equidistant from a radiation source. The scanned object may be non-planar and may be, for example, cylindrical or semi-cylindrical in shape. A curved array also allows radiation to impact the surface of the scintillation pixels at an angle that is perpendicular, or almost perpendicular, to the incident face of the pixel element. The pixels in the array may be equidistant, or essentially equidistant, from a focal line and the pixels may include a z axis (x-ray depth) that is aligned with (extends through) a focal line. In the case of a spherical array, each of the pixels may be oriented (z axis aligned with and incident face perpendicular) to a single focal point at the center of the sphere or partial sphere. The array may be curved around one or more axes, and the radius of curvature may be, for example, less than 100 cm, less than 50 cm, less than 25 cm, less than 10 cm, less, than 5 cm or less than 2.5 cm. Curved shapes include, for example, cylinders, partial cylinders, spheres and partial spheres. Other shapes may be formed to complement particular systems and objects being scanned.

Photodetectors may be positioned to correspond with one or more of the pixel elements on a curved or spherical array. For example, an array of photodiodes may be fixed to a curved substrate so that a photodiode corresponds to each pixel. Photodetectors include, for example, photodiodes, photomultiplier tubes, position sensitive photomultiplier tubes and charged coupled detectors.

Figure 1B:
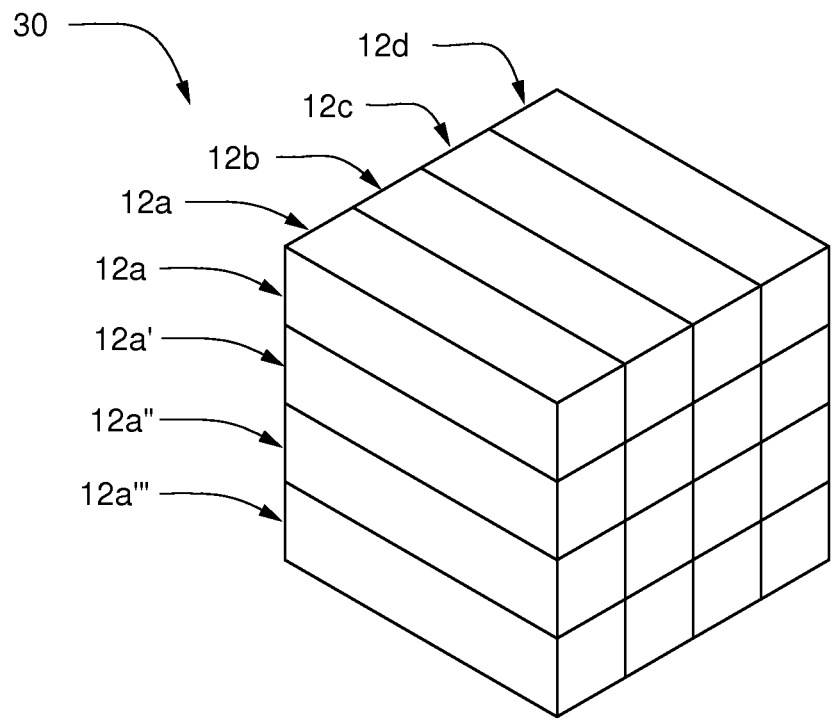
FIG. 1B depicts a two dimensional planar array.

FIG. 1A depicts an example of a linear array 10 that includes a plurality of individual pixel elements 12a, 12b, 12c and 12d. Using pixel element 12a as an example, each pixel may form a generally cuboid structure having a front face 14a, an opposing rear face 16a, first opposing sidewall portions 18a (top) and 20a (bottom) and second opposing sidewall portions 22a (left) and 24a (right). The x, y, and z dimensions of each individual pixel in the array 10 may be selected for a desired application. In the conventional array 10, the pixels 12a, 12b, 12c and 12d are disposed generally parallel to one another. Also, for purposes of this example, it may be assumed that the front face, e.g., 14a, of each respective pixel faces generally toward a radiation source and the rear face, e.g., 16a, of each pixel emits detectable light. The photo detector may be positioned to receive detectable light emitted from rear face 16a. FIG. 1B depicts an example of a 2D array 30 that is similar in many respects to the array 10 of FIG. 1A, except that it includes columns (12a', 12a" and 12a''') as well as rows of pixels. In both FIGS. 1A and 1B the z axis (x-ray depth) for each pixel is generally parallel to the z axis of every other pixel.

Figure 2A:
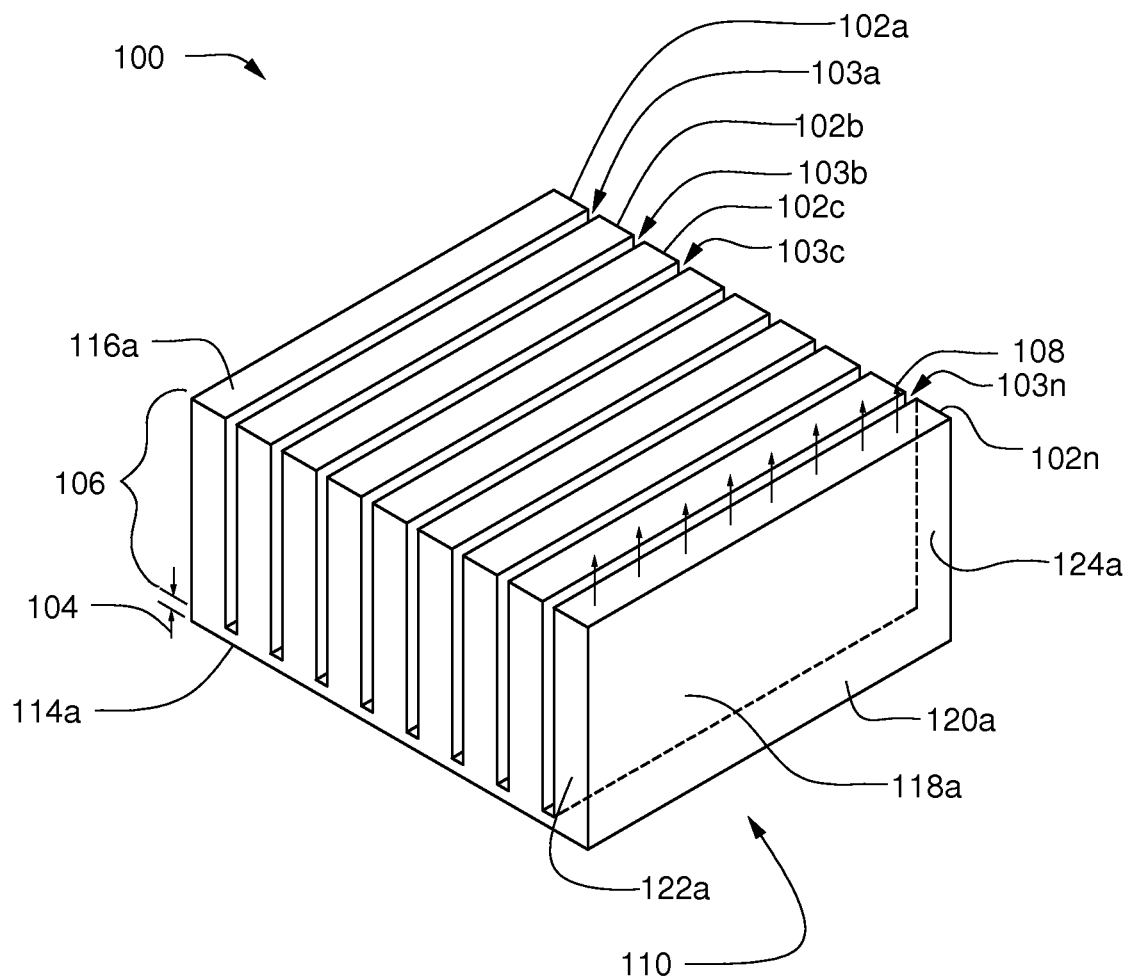
FIG. 2A provides a perspective view of one embodiment of a linear array.

Referring to FIG. 2A, an embodiment of a linear pixelated scintillation crystal array 100 includes a plurality of scintillation crystal elements 102a, 102b, 102c, ... 102n. Each scintillation crystal element 102a, 102b, 120c, ... 102n may be formed by cutting the crystal to a predetermined depth 106, such that a predetermined amount of crystal material remains as a substrate 104, as shown. Each scintillation element may be referred to herein as a "pixel" or "pixel element."

Cutting the crystal may form a plurality of gaps 103a, 103b, 103c, ..., 103n between each pixel. The uncut crystal material substrate 104 may operate to hold the pixels 102a, 102b, 120c, ..., 102n together as an array and may also operate to allow each pixel to be positioned independently of other pixels. In this embodiment, to enable a degree of flexibility of the crystal array 100, the depth of the cut 106 may be such that each pixel has a degree of freedom of rotation with respect to at least one other pixel. The depth of cut 106 may be chosen based on, for example, the flexibility of the specific crystal and the amount of curvature to which the crystal will be shaped. Each of the crystal pixel elements 102a, 102b, 102c, ..., 102n may provide detectable light 108 in response to excitatory radiation 109. Thus, in this example, the front face of each pixel may be represented by the bottom surface shown in the Figure (i.e., the face exposed to radiation 114a), the rear face of each pixel may be represented by the top surface shown in this figure (i.e., the face that emits detectable light 108). Each pixel may include opposing generally parallel sidewall surfaces, e.g., opposing surfaces 118a, 120a and 122a, 124a, that extend between the front face 114a and the rear face 116a. The rear face of each pixel may be associated with a photodetector.

Figure 2B:
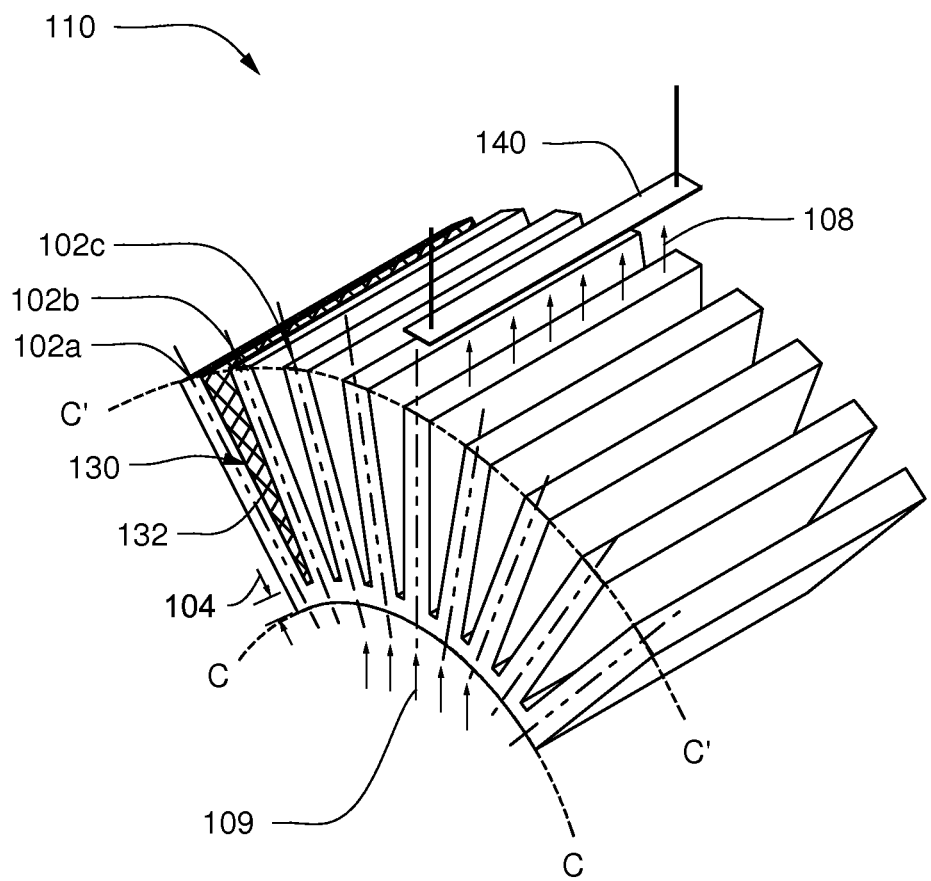
FIG. 2B provides a perspective view of one embodiment of a curved linear array.

Once the crystal 100 is cut to form a plurality of pixels, crystal 100 may offer a degree of flexibility, as shown in FIG. 2B. In this embodiment, pixels 102a, 102b, 102c, ..., 102n may be splayed out so that the front face of at least two of the pixels is disposed along curve C. A wedge shaped gap 130 may be formed between two adjacent pixels, with the width of the gap increasing from front face 114a to rear face 108. A wedge-shaped gap 130 may be defined by the sidewall portion of pixel 102a and the opposite sidewall portion of pixel 102b. A reflective material 132 may be disposed at least partially within wedge-shaped gap 130. In this embodiment, the reflective material 132 may include titanium dioxide or other reflective pigment. Reflective material 132 may have a reflectivity of greater than 90%. In one set of embodiments, reflective material 132 may be selected to have an index of refraction that is the same or less than the index of refraction of the adjacent scintillation crystal pixel or an index of refraction that is 25% less than the index of refraction of the adjacent scintillation crystal pixel. This may improve the transmission of light through each pixel element 102a, 102b, 102c, ..., 102n with minimal scattering or attenuation. Also, the reflective material 132 may fix the relative positions of pixels adjacent to the reflective material. In this manner, the curvature of the array 100 may be fixed using, for example, a hardening reflective material such as a polymer adhesive that may be heat or catalytically cured. The reflective material may be included in an adhesive. Appropriate adhesives include, for example, elastomeric and polymeric materials. These materials include epoxies such as, ECCOBOND® 2 part epoxies, available from Emerson Cummings.

The pixelated scintillation crystal array 110 may be constructed from various types of materials capable of being used in scintillation detectors. These materials include, for example, polymers, ceramics and inorganic crystals. For simplicity, the disclosure will primarily describe crystal scintillators although the methods and/or geometries are applicable to other materials. According to one embodiment, the scintillation array 100 is a crystal such as thallium doped sodium iodide—NaI(Tl)—or cerium-doped lanthanum bromide—LaBr3(Ce). Other hygroscopic or non-hygroscopic crystals may also be used such as, for example, cesium iodide—CsI—and lutetium yttrium orthosilicate—LYSO. One or more activators, or dopants, may be used.

A plurality of photodetector elements may be positioned adjacent the rear face of each of the pixels, along curve C'. One such exemplary photodetector is depicted as photodiode 140. In this embodiment, curve C' may substantially match the curvature of curve C, and C' may have a radius of curvature that differs from that of curve C by the x-ray depth of the pixels (104 plus 106). The scintillation crystal 100 may be coupled directly to the photodetector 140 with optical coupling material or the scintillation crystal 100 may be coupled using a window between the scintillation crystal 110 and the photodetector 112. These methods are described in co-owned Patent Application Ser. No. 61/037,476 filed on Mar. 18, 2008. In either case, the photodetector 140 may be positioned with respect to crystal array 100, and more particularly with respect to a pixel (e.g., pixel 102c), to receive the scintillation light 108 provided by each of the crystal pixel elements 102a, 102b, 102c, . . . , 102n. It should be understood that although only one photodetector 140 is depicted, a plurality of photodetector elements may be provided that may be similar to photodetector 140 and disposed along curve C' to receive scintillation light from each respective pixel in the array 100.

The pixelated scintillation crystal array 100 may be configured such that each of the crystal pixel elements 102a, 102b, 102c, . . . , 102n detects radiation and transmits detectable light independently of other crystal pixel elements 102a, 102b, 102c, . . . , 102n. Thus, radiation may be measured for each of the individual pixel elements 102a, 102b, 102c, . . . , 102n. The individual pixel elements 102a, 102b, 102c, . . . , 102n may not have homogeneous properties.

Figure 3A:
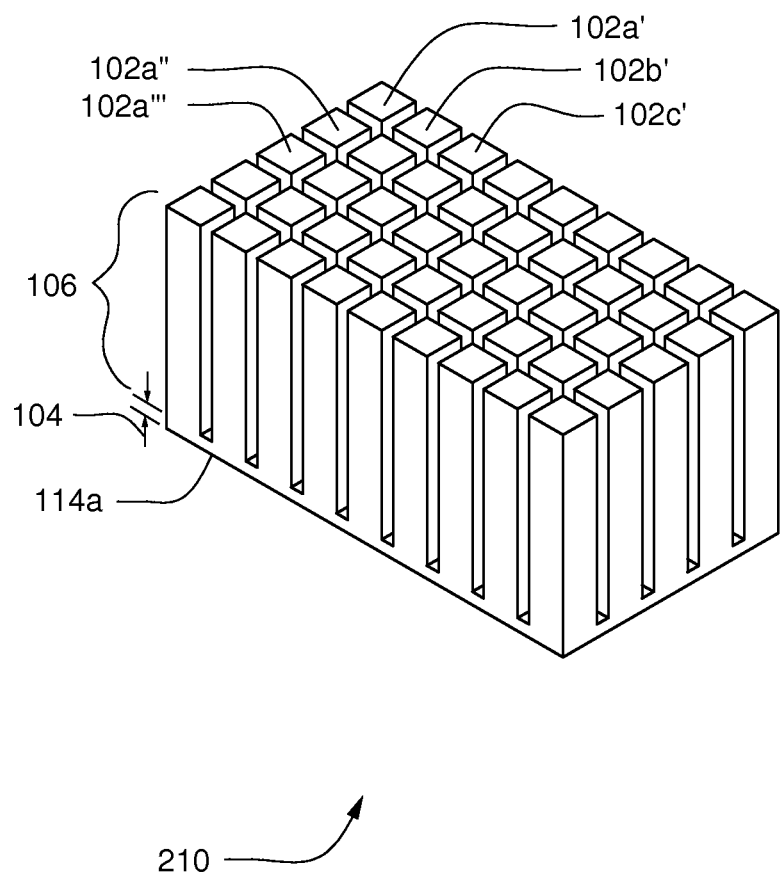
FIG. 3A provides a perspective view of one embodiment of a two dimensional array.
Figure 3B:
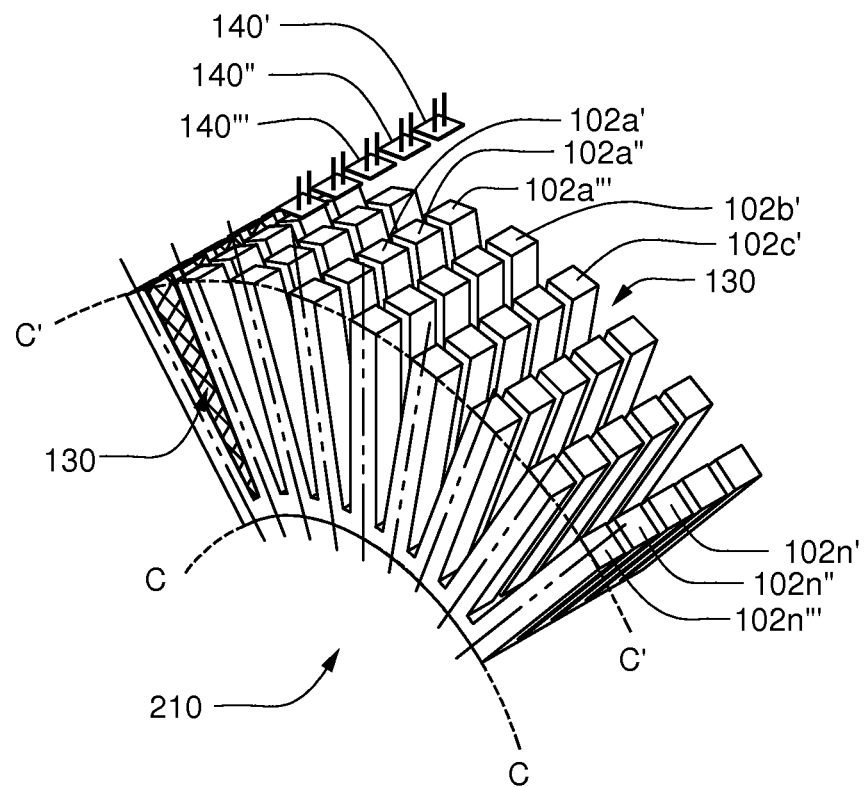
FIG. 3B provides a perspective view of one embodiment of a curved two dimensional array.

A two dimensional array embodiment 210 is provided in FIG. 3B. The pixels 102a', 102a" and 102a'" may be formed from pixel 102a of the linear array of FIGS. 2A and 2B. By making a second set of cuts across the first set of grooves, a plurality of rows (or columns) can be produced to provide a planar array of pixels 200 having a second dimension. Thus, as shown in FIG. 3A both rows and columns of pixels can be used to provide a greater range of pixels for providing improved imaging. The length of the pixel along the z axis, or x-ray depth, may be the same in one dimensional and two dimensional embodiments that are formed from similarly dimensioned crystal substrates. Pixels may have x, y and z dimensions wherein z is smaller than x and/or y or wherein z is greater than x and/or y. In some embodiments, x and y may be equal while in others, one of x or y may be smaller than the other. After the array has been conformed to curve C (FIG. 3B), the incident face of each of pixels 102a', 102b' and 102c' may be equidistant from a focal point and pixels 102a', 102a" and 102a'" may be equidistant from a focal line. Thus, in a curved one dimensional array, the pixels may be equidistant from a focal point and in a curved two dimensional array the pixels may be equidistant from a focal line. In a three dimensional spherical or partially spherical array the pixel elements may be equidistant from a focal point. In a curved or spherical array, the z axis of a first pixel may be non-parallel to the z axis of an adjacent pixel.

Each pixel may be associated with a photodetector. For example, in FIG. 2B, photodiode 140 is positioned to provide output in response to detectable light emitted from pixel 102c. Likewise, in FIG. 3B, photodiodes 140', 140" and 140'" are positioned to provide unique output in response to detectable light emitted from pixels 102a', 102a" and 102a'", respectively. A number of photodetectors may be fixed in a single photodetector array that conforms to the shape of the scintillation array. For instance, a semicylindrical scintillation array may be complemented by a semicylindrical photodetector array. A hemispherical scintiallation array may be complemented by a hemispherical photodetector array.

In one set of embodiments a two dimensional scintillation array can be produced from a single monolithic substrate. A cuboid shaped monolith crystal having appropriate length, width and depth for the finished array is selected. Using a multi-wire diamond wire saw, parallel channels are cut down the z axis (x-ray depth) in they direction until the saw is within a predetermined distance from the bottom surface of the crystal. This predetermined distance may be adjusted based on the flexibility of the particular crystal material as well as the amount of curvature that will be applied to the array. After a first set of cuts are made, the substrate (or the saw) may then be rotated 90 degrees and a second set of grooves can be cut to the same depth as the first set. The two cutting procedures can result in an array of square pillars (see FIG. 3A) extending from the base substrate. For producing one dimensional arrays, the second cutting step may be eliminated (see FIG. 2A). After grooves have been cut to divide the monolith into pixels, the array may be curved by shaping it over a die of appropriate curvature. In some embodiments this is facilitated by heating the substrate crystal to plasticity so that the crystal may more easily conform to the curvature of the die. As the substrate is pressed across the curved die, the individual pixels are splayed apart resulting in wedge shaped gaps between the pixels (FIG. 3B). The sharpness of the wedge may be defined by the radius of curvature and the physical dimensions of the pixels. Typically a smaller radius of curvature will result in a wider angled wedge.

After the array has been conformed to the desired curve, the resulting wedge shapedgaps may be filled with an adhesive, such as a polymer. The adhesive may be, for example, an epoxy. Reflective materials may be added to the adhesive to promote the channeling of detectable light. The adhesive may also permanently fix the array in its curved formation—a "fixed array." In some embodiments the adhesive may exhibit a ShoreD hardness of between 10 and 100, between 30 and 80 or between 30 and 50. In one specific embodiment the hardness of the adhesive is 40.

Figure 4A:
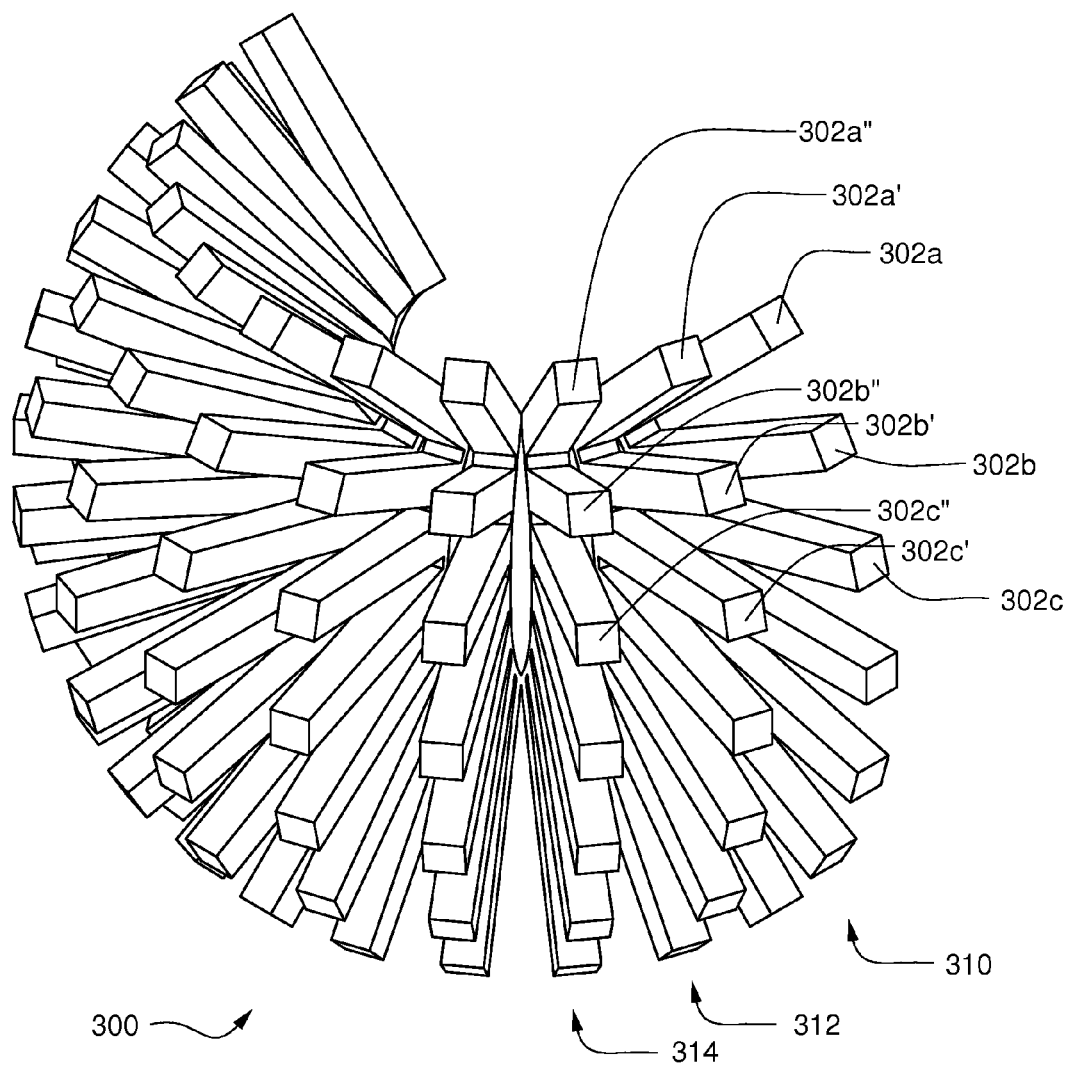
FIG. 4A provides a perspective view of one embodiment of a partially spherical three dimensional array.
Figure 4B:
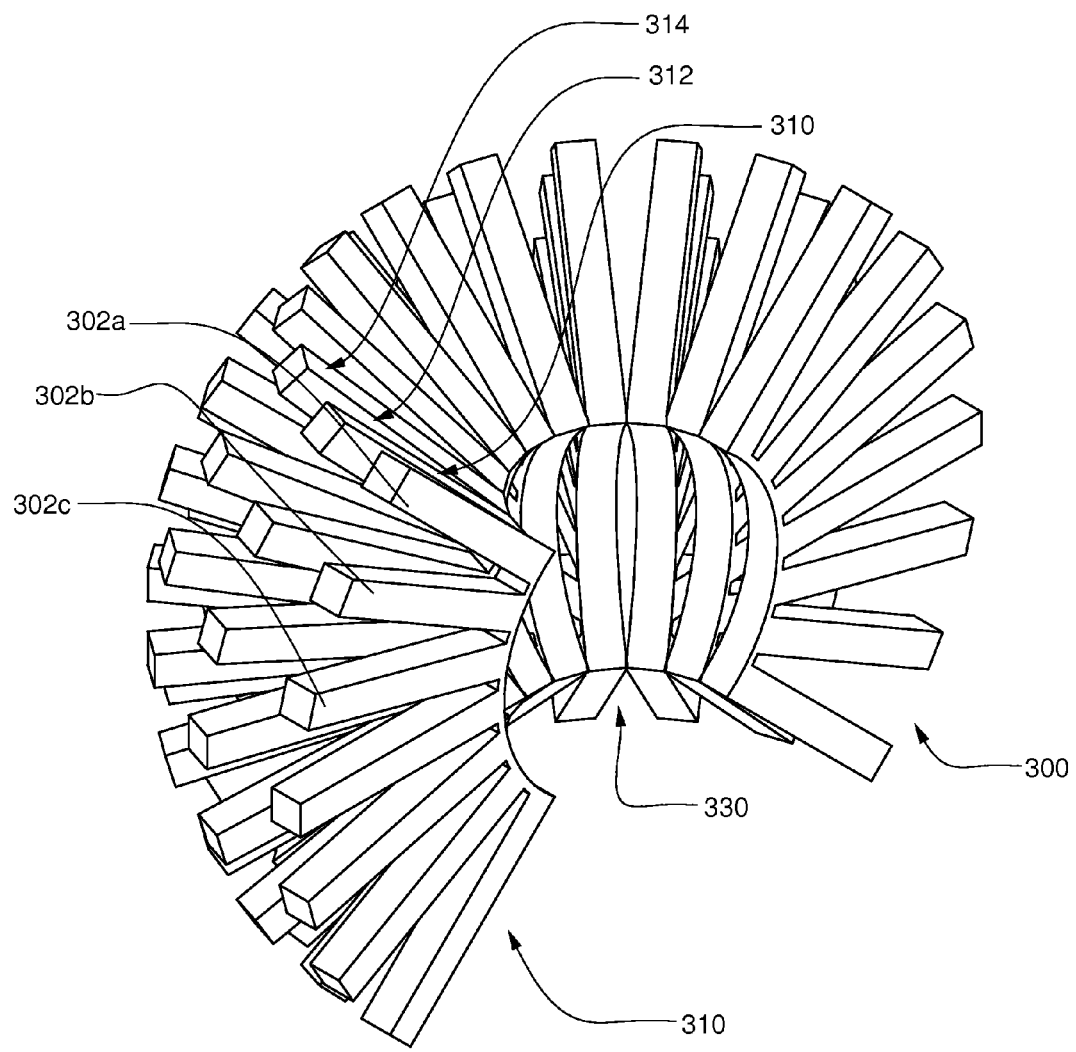
FIG. 4B provides an alternative view of the embodiment of FIG. 4A.

In further embodiments a three dimensional (3-D) scintillation array can be constructed. In one embodiment a 2-D curved array may provide components for a three dimensional (3-D) spherical array. Different perspective views of a hemispherical array 300 are provided in FIGS. 4A and 4B. A 3-D spherical or partially spherical array may have a number of pixels that are equidistant from a focal point and that are positioned so that each pixel's incident surface is normal to radiation emitted from a central focal point. Starting with the curved two dimensional array of FIG. 3B (with or without adhesive between the pixels), individual curved linear arrays may be obtained by removing (e.g., cutting) individual curved linear arrays from the two dimensional array of FIG. 3B. For instance, the array segment shown in FIG. 3B can be divided into five independent curved linear arrays of equal length. The result is a plurality of independent curved linear arrays 310, 312, 314, etc. that may each have the same number of pixels and the same degree of curvature. These curved linear arrays may be mounted around a sphere having a radius that is substantially equivalent to the radius of curvature of the linear arrays. The linear arrays may be equally spaced around the sphere or around a portion of the sphere, for example a hemisphere, as shown in FIGS. 4A and 4B. A photodetector can be associated with each pixel and a spherical or partially spherical photodetector array can be constructed and arranged around scintillation array 300. The individual curved linear arrays may be fixed in position by flooding the spaces between the linear arrays with an adhesive, such as an epoxy resin. Reflective additives may also be used to improve light transmission. In such a spherical or partially spherical formation, the z axis of each of the pixels may be aligned with a focal point at the center of the sphere. Each of the pixels may have an incident surface that is equidistant from the focal point. For example, in FIGS. 4A and 4B, pixels 302a, 302b and 302c may each be equidistant from a focal point and may each have a z axis that is aligned with the focal point. This may also be true of pixels 302a, 302a' and 302a" which are each integral to a different curved linear array (in this case 310, 312 and 314, respectively). In the embodiment shown, each of pixels 302a, 302a', 302a", 302b, 302b', 302b", 302c, 302c' and 302c" may 1) be equidistant from a focal point; 2) have a z axis aligned with a focal point and/or 3) have an incident face that is perpendicular to radiation emanating from a focal point. The incident face of two or more of the pixels may be disposed along the surface of a common sphere. This arrangement may be useful for the scanning of substantially spherical objects. For example, a 3-D array can be configured to fit a human head in cavity 330.

In another set of embodiments, a curved array may be produced by joining into an array individual pixels that do not initially share a common substrate. For instance, individual pixels may be placed in a curved or spherical die that includes cavities sized for receiving crystal pixels. The cavities may be oriented to provide a predetermined array pattern. The die may be of a flexible material and may be, for example, a half cylinder or a hemisphere. After placement in the die, the crystals may be flooded with a polymer to fix them in a predetermined position. The resulting array can then be pulled from the die or the die can be eliminated, such as by dissolving. Other shapes of two and three dimensional arrays may also be produced in this manner. For example, arrays in the shape of whole or partial polyhedrons, irregular shapes, and arrays with varying curvatures may be made.

In another aspect, curved arrays can be produced by attaching scintillators to a flexible substrate. This technique may be preferred with scintillators of reduced flexibility, such as, for instance, those comprising BGO, CdWO$_4$, LYSO and ceramics. Individual scintillators may be attached, in parallel, to a flexible polymeric sheet. The scintillators may be spaced to produce gaps there between of predetermined width. The sheet may be, for example, a thermopolymer or elastomeric material. The sheet may be transparent to x-rays or other ionizing radiation. The individual scintillators may be permanently or temporarily attached to the flexible substrate via an adhesive, heat welding, sonic welding, etc. The flexible substrate may be in a planar configuration, resulting in an array that can resemble that of FIG. 2A, except that thickness 104 represents the flexible substrate rather than the crystal substrate discussed earlier. After the scintillators have been affixed to the substrate, the newly formed linear array can be splayed to produce a curved linear array similar to that shown in FIG. 2B. The wedge-shaped gaps that form between the scintillators may be flooded partially or totally with an adhesive, such as a polymer, to fix the array in a desired curved array configuration. The adhesive may include a reflective material. In some embodiments the flexible substrate may be removed after curing the adhesive. Additional grooves can be cut across the scintillators to increase the number of pixels and to form a two dimensional array similar to that shown in FIG. 3B. The additional set of parallel grooves can subsequently be flooded with an adhesive to fix the configuration of the two dimensional array. Linear curved arrays may be removed from (cut away) the two dimensional array to produce new scintillation arrays, such as the three dimensional spherical arrays described above.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified, unless clearly indicated to the contrary.

All references, patents and patent applications and publications that are cited or referred to in this application are incorporated in their entirety herein by reference.

What is claimed is:

1. A scintillation array, comprising:
an array of scintillation pixel elements, each of the scintillation pixel elements having a front face and a rear face, wherein:
at least a first scintillation pixel element and a second scintillation pixel element are arranged such that each respective front face is disposed along a curve and affixed to a curved common substrate, and each respective rear face, opposite the corresponding front face, is configured to be coupled to one or more photodetectors.

2. The scintillation array of claim 1 defining a wedge-shaped gap between a sidewall surface of said first scintillation pixel element and a sidewall surface of said second scintillation pixel element wherein the width of the gap expands from the front face toward the rear face of the pixel elements.

3. The scintillation array of claim 2, wherein the wedge-shaped gap is substantially filled by an adhesive or a reflective material.

4. The scintillation array of claim 1, wherein the z axis of the first and second pixel elements are non-parallel.

5. The scintillation array of claim 4, wherein the z axis of a third pixel element is parallel to the z axis of the first pixel element.

6. The scintillation array of claim 1, further comprising a reflective material surrounding at least a portion of the crystal pixel elements.

7. The scintillation array of claim 1, wherein the array forms a partial or complete cylinder.

8. The scintillation array of claim 1, wherein the array forms a partial or complete sphere.

9. The scintillation array of claim 1, wherein the first and second pixel elements comprise a material selected from the group consisting of NaI(Tl), CsI(Tl), CsI, BGO, LYSO, and $CdWO_4$.

10. The scintillation array of claim 1, wherein the substrate comprises a polymeric sheet.

11. A scintillation array comprising:
first and second cuboid shaped pixels fixed in the array, each of the first and second cuboid shaped pixels having a front face and a rear face wherein:
each respective front face is affixed on a curved common substrate including a polymeric sheet, and each respective rear face, opposite the corresponding front face, is configured to be coupled to one or more photodetectors;
a z axis of the first pixel is non-parallel to a corresponding z axis of the second pixel.

12. The scintillation array of claim 11, wherein the first and second pixels define a wedge shaped gap.

13. The scintillation array of claim 12, wherein the wedge-shaped gap is substantially filled by an adhesive or a reflective material.

14. The scintillation array of claim 11, further comprising a reflective material surrounding at least a portion of the pixels.

15. The scintillation array of claim 11, wherein the front faces are affixed to the common crystal substrate via an adhesive, heat welding, or sonic welding.

16. The scintillation array of claim 11, wherein the array forms a partial or complete cylinder.

17. The scintillation array of claim 11, wherein the array forms a partial or complete sphere.

18. The scintillation array of claim 11, wherein the first and second pixels comprise an inorganic crystal.

19. The scintillation array of claim 11, wherein the first and second pixels comprise a material selected from the group consisting of NaI(Tl), CsI(Tl), CsI, LYSO, BGO and $CdWO_4$.

20. The scintillation array of claim 11, comprising a third pixel having a z axis parallel to the z axis of the first pixel element.

* * * * *